(12) United States Patent
Hu et al.

(10) Patent No.: US 12,322,707 B2
(45) Date of Patent: Jun. 3, 2025

(54) LARGE DIE WAFER, LARGE DIE AND METHOD OF FORMING THE SAME

(71) Applicant: WUHAN XINXIN SEMICONDUCTOR MANUFACTURING CO., LTD., Hubei (CN)

(72) Inventors: Sheng Hu, Hubei (CN); Jun Zhou, Hubei (CN); Peng Sun, Hubei (CN); Qiong Zhan, Hubei (CN); Senhua Shi, Hubei (CN); Hu Yang, Hubei (CN)

(73) Assignee: WUHAN XINXIN SEMICONDUCTOR MANUFACTURING CO., LTD., Hubei (CN)

( * ) Notice: Subject to any disclaimer, the term of this patent is extended or adjusted under 35 U.S.C. 154(b) by 485 days.

(21) Appl. No.: 17/566,398

(22) Filed: Dec. 30, 2021

(65) Prior Publication Data

US 2022/0399282 A1    Dec. 15, 2022

(30) Foreign Application Priority Data

Jun. 11, 2021  (CN) .......................... 202110654051.6

(51) Int. Cl.
| | | |
|---|---|---|
| *H01L 23/544* | (2006.01) | |
| *G03F 7/00* | (2006.01) | |
| *H01L 21/68* | (2006.01) | |

(52) U.S. Cl.
CPC ........ *H01L 23/544* (2013.01); *G03F 7/70633* (2013.01); *H01L 21/682* (2013.01);
(Continued)

(58) Field of Classification Search
CPC ................ H01L 23/544; H01L 21/682; H01L 2223/54426; H01L 2223/54466; G03F 7/70475; G03F 7/70633; G01N 2223/6116
See application file for complete search history.

(56) References Cited

U.S. PATENT DOCUMENTS

| | | | | |
|---|---|---|---|---|
| 10,665,455 | B2 * | 5/2020 | Lu | ...................... H01L 21/76895 |
| 2015/0082265 | A1 * | 3/2015 | Huang | .................. H01L 23/528 |
| | | | | 716/111 |

(Continued)

FOREIGN PATENT DOCUMENTS

| | | |
|---|---|---|
| CN | 109461717 A | 3/2019 |
| CN | 111081638 A | 4/2020 |

*Primary Examiner* — Vu A Vu
*Assistant Examiner* — Jeremy Daniel Watts
(74) *Attorney, Agent, or Firm* — MUNCY, GEISSLER, OLDS & LOWE, P.C.

(57) ABSTRACT

The present invention provides a large die, a method of forming the large die and a large die wafer. The method includes: providing a wafer containing a plurality of large dies each having a size greater than that of a maximum field of exposure of a stepper, each large die including at least two die portions to be stitched together, the die portions including a substrate and a first metal layer, the first metal layer including at least to-be-interconnected metal layers for interconnection of the die portions; and forming a second metal layer including at least inter-die interconnecting metal layers crossing dummy dicing margins between adjacent die portions and coming into electrical connection with the to-be-interconnected metal layers of the adjacent die portions. The present invention allows interconnection of the die portions to be stitched together in each large die.

20 Claims, 5 Drawing Sheets

(52) U.S. Cl.
CPC ............... *G01N 2223/6116* (2013.01); *H01L 2223/54426* (2013.01); *H01L 2223/54466* (2013.01)

(56) References Cited

U.S. PATENT DOCUMENTS

| | | | |
|---|---|---|---|
| 2019/0164899 A1* | 5/2019 | Hu | ............................ G03F 1/42 |
| 2019/0237461 A1 | 8/2019 | Or-Bach et al. | |
| 2020/0066651 A1* | 2/2020 | Burton | ................ G03F 7/70741 |
| 2020/0126785 A1* | 4/2020 | Lu | .................... H01L 21/76895 |
| 2020/0176419 A1 | 6/2020 | Dabral et al. | |
| 2020/0203308 A1* | 6/2020 | Fricker | ................... H01L 24/25 |
| 2021/0134723 A1 | 5/2021 | May et al. | |
| 2022/0302078 A1* | 9/2022 | Chang | ..................... H01L 24/83 |
| 2022/0319894 A1* | 10/2022 | Seddon | ................ H01L 23/544 |

* cited by examiner

| PROVIDING A WAFER CONTAINING LARGE DIES EACH HAVING A SIZE GREATER THAN THAT OF MAXIMUM FIELD OF EXPOSURE OF STEPPER, EACH LARGE DIE COMPRISING AT LEAST TWO DIE PORTIONS TO BE STITCHED TOGETHER, EACH DIE PORTION COMPRISING A MAIN DIE REGION AND DUMMY DICING MARGINS SURROUNDING THE MAIN DIE REGION, EACH DIE PORTION HAVING A SIZE THAT IS SMALLER THAN OR EQUAL TO THAT OF MAXIMUM FIELD OF EXPOSURE OF STEPPER | S1 |

↓

| DIE PORTIONS COMPRISING A SUBSTRATE, A DIELECTRIC LAYER ON THE SUBSTRATE AND A FIRST METAL LAYER EMBEDDED IN THE DIELECTRIC LAYER, THE FIRST METAL LAYER COMPRISING AT LEAST TO-BE-INTERCONNECTED METAL LAYERS FOR INTERCONNECTION | S2 |

↓

| FORMING A SECOND METAL LAYER COMPRISING AT LEAST INTER-DIE INTERCONNECTING METAL LAYERS CROSSING DUMMY DICING MARGINS BETWEEN ADJACENT DIE PORTIONS AND COMING INTO ELECTRICAL CONNECTION WITH THE TO-BE-INTERCONNECTED METAL LAYERS OF ADJACENT DIE | S3 |

Fig. 1

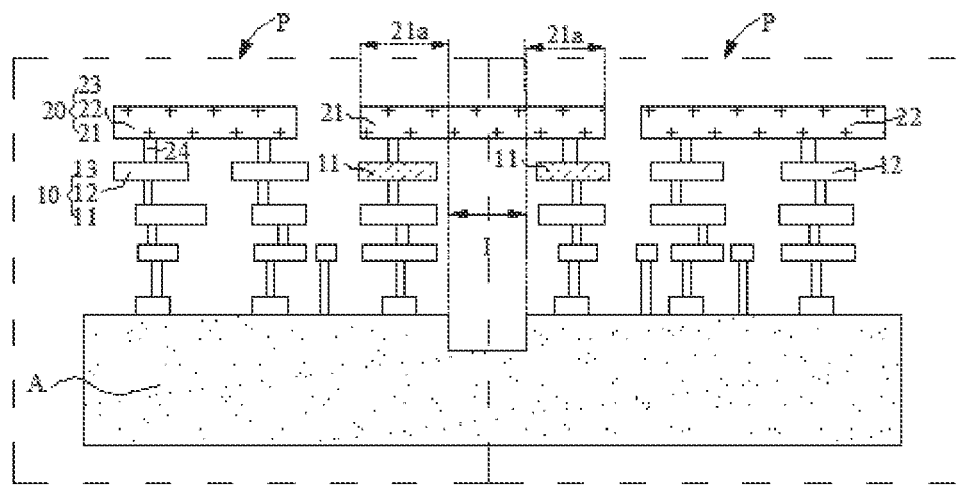

Fig. 2

LARGE DIE WAFER, LARGE DIE AND METHOD OF FORMING THE SAME

CROSS-REFERENCE TO RELATED APPLICATION

This application claims the priority of Chinese patent application number 202110654051.6, filed on Jun. 11, 2021, the entire contents of which are incorporated herein by reference.

TECHNICAL FIELD

The present invention pertains to the technical field of integrated circuit (IC) fabrication and, more specifically, to a large die, a method of forming the large die, and a large die wafer.

BACKGROUND

Conventionally, a photolithography stepper exposes one die in each step, and the size of the formed die must be equal to or smaller than that of the stepper's maximum field of exposure. With the development of semiconductor technology, IC chips are finding use in more and more applications including those requiring the use of large chips (e.g., high-speed computing), which are typically sized larger than the maximum field of exposure of existing of any existing stepper (e.g., 26 mm×33 mm) For these applications, it is necessary to use stitching techniques. As the name implies, in these techniques, different portions of a large die are exposed in individual steps in such a manner that they are switched to form the large die.

In practical applications, still further improvement would be desirable in terms of functional integration of so-stitched die portions.

SUMMARY OF THE DISCLOSURE

It is an object of the present invention to provide a large die, a method of forming the large die, and a large die wafer. The large die includes multiple die portions to be stitched together, which can be interconnected to allow large die level interconnection, optimized electrical signal interconnection of the large die and increased functional integration.

The present invention provides a method of forming a large die, which includes:
  providing a wafer containing a number of large dies each having a size greater than that of a maximum field of exposure of a stepper, each large die comprising at least two die portions to be stitched together, each die portion comprising a main die region and dummy dicing margins surrounding the main die region, each die portion having a size that is smaller than or equal to that of the maximum field of exposure of the stepper, the die portions each comprising a substrate, a dielectric layer on the substrate and a first metal layer embedded in the dielectric layer, the first metal layer comprising at least to-be-interconnected metal layers for interconnection of the die portions to be stitched together; and
  forming a second metal layer comprising at least inter-die interconnecting metal layers crossing the dummy dicing margins between adjacent die portions and coming into electrical connection with the to-be-interconnected metal layers of the adjacent die portions.
Additionally, the inter-die interconnecting metal layers may comprise first interconnecting sections and second interconnecting sections, the first interconnecting sections disposed in the main die region, the second interconnecting sections crossing the dummy dicing margins between adjacent die portions and coming into electrical connection with the to-be-interconnected metal layers of the adjacent die portions.

Additionally, the formation of the second metal layer may comprise:
  forming photoresist over the dielectric layer; and
  exposing the die portions successively one by one using a first photomask module, the first photomask module having an exposure pattern comprising at least features for the first interconnecting sections in the main die region.

Additionally, the second interconnecting sections may comprise X-directional second interconnecting sections and Y-directional second interconnecting sections, wherein:
  the X-directional second interconnecting sections extend along an X direction and come into electrical connection with X-directionally extending first interconnecting sections of adjacent die portions to be stitched together; and
  the Y-directional second interconnecting sections extend along a Y direction and come into electrical connection with Y-directionally extending first interconnecting sections of adjacent die portions to be stitched together.

Additionally, the formation of the second metal layer may further comprise:
  exposing the X-directional second interconnecting sections of adjacent die portions on the photoresist successively one by one using a second photomask module, the second photomask module having an exposure pattern comprising at least features for the X-directional second interconnecting sections; and
  exposing the Y-directional second interconnecting sections of adjacent die portions on the photoresist successively one by one using a third photomask module, the second photomask module having an exposure pattern comprising at least features for the Y-directional second interconnecting sections.

Additionally, the formation of the second metal layer may further comprise:
  performing an etching process on portions of the dielectric layer exposed from the photoresist, which correspond to the first interconnecting sections, the X-directional second interconnecting sections and the Y-directional second interconnecting sections, thereby forming openings in which the first metal layer is exposed;
  filling the openings with a metal layer, resulting in the formation of the inter-die interconnecting metal layers; and
  planarizing a top surface of the second metal layer using a chemical mechanical polishing process.

Additionally, the first metal layer may further comprise first mark metal layers having thereon first front-side alignment marks, first front-side overlay marks, second front-side alignment marks, second front-side overlay marks, third front-side alignment marks and third front-side overlay marks.

Additionally, the second metal layer may further comprise second mark metal layers having thereon first backside alignment marks, first backside overlay marks, second backside alignment marks, second backside overlay marks, third backside alignment marks and third backside overlay marks, wherein:

the first backside alignment marks are matched to the first front-side alignment marks and the first backside overlay marks to the first front-side overlay marks in order to enable alignment of the second metal layer with the first metal layer during the exposure using the first photomask module;

the second backside alignment marks are matched to the second front-side alignment marks and the second backside overlay marks to the second front-side overlay mark in order to enable alignment of the second metal layer with the first metal layer during the exposure using the second photomask module; and the third backside alignment marks are matched to the third front-side alignment marks and the third backside overlay marks to the third front-side overlay marks in order to enable alignment of the second metal layer with the first metal layer during the exposure using the third photomask module.

Additionally, the first metal layer may further comprise leading out metal layers in the main die region, wherein the second metal layer further comprises intra-die metal layers in the main die region, and wherein in each die portion, the intra-die metal layers are electrically connected to the leading out metal layers along a thickness direction.

Additionally, the second metal layer may be any of the second bottom-most to topmost metal layers, which are sequentially stacked from the substrate upward along a thickness direction of the large dies.

The present invention also provides a large die wafer, comprising:
  a number of large dies each having a size greater than that of a maximum field of exposure of a stepper, each large die comprising at least two die portions to be stitched together, each die portion comprising a main die region and dummy dicing margins surrounding the main die region, each die portion having a size that is smaller than or equal to that of the maximum field of exposure of the stepper,
  the die portions comprising a substrate, a dielectric layer on the substrate and a first metal layer embedded in the dielectric layer, the first metal layer comprising at least to-be-interconnected metal layers for interconnection of the die portions to be stitched together; and
  a second metal layer comprising at least inter-die interconnecting metal layers crossing the dummy dicing margins between adjacent die portions and coming into electrical connection with the to-be-interconnected metal layers of the adjacent die portions.

The present invention also provides a large die having a size greater than that of a maximum field of exposure of a stepper. The large die comprises:
  at least two die portions to be stitched together, each die portion comprising a main die region and dummy dicing margins surrounding the main die region, each die portion having a size that is smaller than or equal to that of the maximum field of exposure of the stepper,
  the die portions comprising a substrate, a dielectric layer on the substrate and a first metal layer embedded in the dielectric layer, the first metal layer comprising at least to-be-interconnected metal layers for interconnection of the die portions to be stitched together; and
  a second metal layer comprising at least inter-die interconnecting metal layers crossing the dummy dicing margins between adjacent die portions and coming into electrical connection with the to-be-interconnected metal layers of the adjacent die portions.

The present invention is advantageous over the prior art as follows:

It provides a method of forming a large die, comprising: providing a wafer containing a number of large dies each having a size greater than that of a maximum field of exposure of a stepper, each large die comprising at least two die portions to be stitched together, each die portion comprising a main die region and dummy dicing margins surrounding the main die region, the die portions comprising a substrate and a first metal layer, the first metal layer comprising at least to-be-interconnected metal layers for interconnection of the die portions to be stitched together; and forming a second metal layer comprising at least inter-die interconnecting metal layers crossing the dummy dicing margins between adjacent die portions and coming into electrical connection with the to-be-interconnected metal layers of the adjacent die portions. According to the present invention, large die level interconnection is achieved by the above interconnection design of the die portions. The interconnection design allows functional extension of the smaller die portions and optimized electrical signal interconnection of the large die, thus realizing increased functional integration. Moreover, it allows the fabrication of full size three-dimensionally integrated dies with increased flexibility and higher compatibility.

BRIEF DESCRIPTION OF THE DRAWINGS

FIG. 1 is a flowchart of a method for forming a large die according to an embodiment of the present invention.

FIG. 2 is a partial cross-sectional view of a large die according to an embodiment of the present invention taken along line BB' in FIG. 6b.

Figure 3:
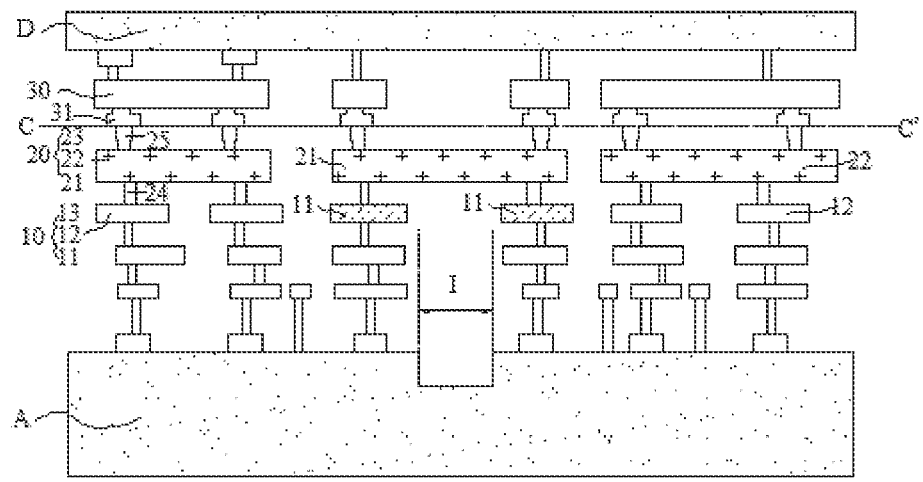
FIG. 3 is a schematic illustration of the large die having undergone a bonding process according to an embodiment of the present invention.

In these figures,
  C denotes a large die; P, a die portion to be stitched; Pm, a main die region; I, a dummy dicing margin; A, a substrate; D, a substrate; 10, a first metal layer; 11, a to-be-interconnected metal layer; 12, a leading-out metal layer; 13, a first mark metal layer; 131*a*, a first front-side alignment mark; 131*b*, a first front-side overlay mark; 132a, a second front-side alignment mark; 132b, a second front-side overlay mark; 133a, a third front-side alignment mark; 133b, a third front-side overlay mark;

20, a second metal layer; 21, an inter-die interconnecting metal layer; 21a, a first interconnecting section; 21b, a second interconnecting section; 21bx, an X-directional second interconnecting section; 21by, a Y-directional second interconnecting section; 22, an intra-die metal layer; 23, a second mark metal layer; 231a, a first backside alignment mark; 231b, a first backside overlay mark; 232a, a second backside alignment mark; 232b, a second backside overlay mark; 233a, a third backside alignment mark; 233b, a third backside overlay mark; 24, a plug; and 25, 30 and 31, metal layers.

DETAILED DESCRIPTION

On the basis of the above discussion, in embodiments of the present invention, there is provided a method of forming a large die. The present invention will be described in greater detail below by way of specific embodiments with reference to the accompanying drawings. Advantages and features of the present invention will become more apparent from the following description. Note that the figures are provided in a very simplified form not necessarily drawn to exact scale for the only purpose of helping to explain the embodiments disclosed herein in a more convenient and clearer way.

In embodiments of the present invention, there is provided a method of forming a large die. As shown in FIG. 1, the method includes:

providing a wafer containing a number of large dies each having a size that is greater than that of a maximum field of exposure of a stepper and including at least two die portions to be stitched together, each of the two die portions having a size that is equal to or smaller than the maximum field of exposure of the stepper, the die portions having dummy dicing margins formed at their boundaries, the die portions each comprising a substrate, a dielectric layer on the substrate and a first metal layer embedded in the dielectric layer, the first metal layer comprising at least to-be-interconnected metal layers for enabling interconnection between the die portions to be stitched together; and forming a second metal layer comprising at least inter-die interconnecting metal layers crossing the dummy dicing margins between adjacent die portions and coming into electrical connection with the individual to-be-interconnected metal layers of the adjacent die portions.

A detailed description of the various steps in the method according to an embodiment of the present invention is set forth below with reference to FIGS. 2 to 7b.

Figure 6A:
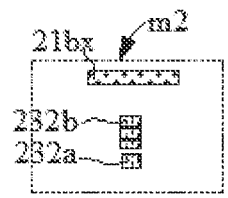
FIG. 6a is a top view of a second photomask module used in the method according to an embodiment of the present invention.
Figure 6B:
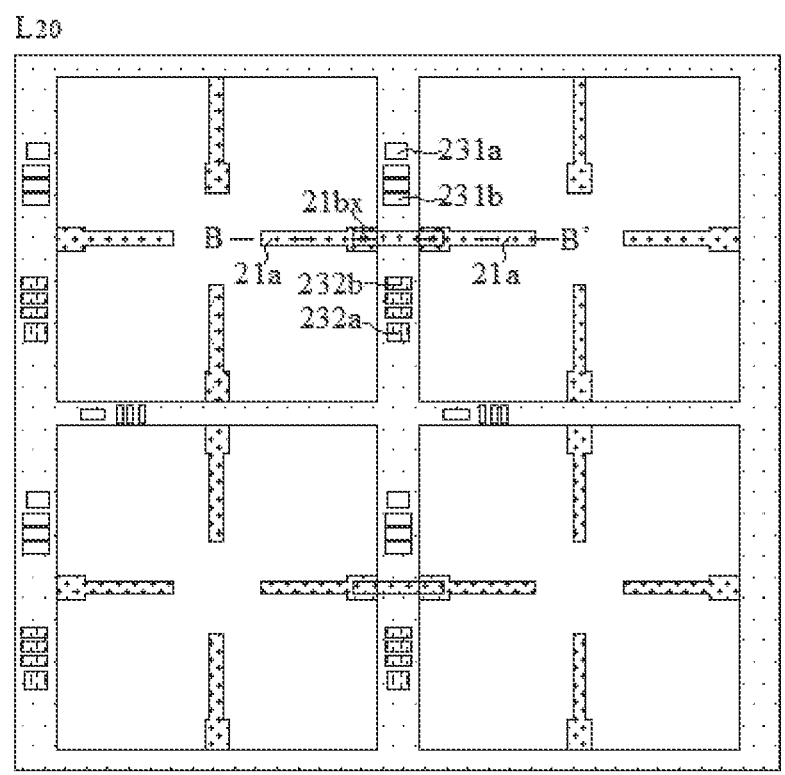
FIG. 6b is a top view of a pattern formed by exposure using the second photomask module and subsequent development in the method according to an embodiment of the present invention.

FIG. 2 is a partial cross-sectional view of a large die according to an embodiment of the present invention taken along line BB' in FIG. 6b. FIG. 3 is a schematic illustration of the large die that has been bonded according to an embodiment of the present invention. FIG. 7b is a top view of a pattern formed by exposure using a third photomask module and subsequent development in the method according to an embodiment of the present invention, i.e., a top view of a layer $L_{20}$ where the second metal layer 20 of the large die is located.

As shown in FIGS. 2 and 7b, a wafer (not shown) is provided, which contains a number of large dies C, each having a size that is greater than that of a maximum field of exposure of a stepper. For example, the current mainstream steppers have a 26 mm×33 mm maximum field of exposure. Each large die includes at least two die portions P to be stitched together, such as 4 die portions P, as shown in FIG. 7b as an example. The number of die portions P in each large die C may be determined as practically needed. The large die C is formed by forming the die portions P in repeated (in case of the same exposure pattern) or multiple (in case of the same or different exposure patterns) exposure steps so that the formed die portions P are stitched together to constitute the large die C and that dummy dicing margins I are defined between boundaries of adjacent die portions P. The dummy dicing margins I serve to demarcate the die portions, without actual dicing actions performed, so that the final large die C is a monolithic die. Each die portion P is formed in a single exposure step, and the multiple die portions are formed in repeated or multiple exposure steps.

The die portions P each include a substrate A, a dielectric layer (not shown) deposited on the substrate A and a first metal layer 10 embedded in the dielectric layer. The first metal layer 10 includes to-be-interconnected metal layers 11 for interconnection between the various die portions P. In the dielectric layer, there may be several embedded metal layers, and the first metal layer may be one of these layers. A second metal layer is disposed above and adjacent to the first metal layer, in order to at least bring to-be-interconnected metal layers for adjacent die portions P into electrical connection with each other. That is, electrical connection of the to-be-interconnected metal layers for adjacent die portions P can be achieved by any metal layer as practically needed. Moreover, electrical connection of the to-be-interconnected metal layers for adjacent die portions P is not limited to being achieved by a single metal layer. Rather, electrical connection of the to-be-interconnected metal layers for adjacent die portions P may be achieved similarly by two or more second metal layers.

FIG. 3 is a schematic illustration of the large die having undergone a bonding process according to an embodiment of the present invention. As shown in FIG. 3, the wafer containing the large die is bonded to another wafer at an interface CC'. The other wafer includes a substrate D, a dielectric layer deposited on the substrate D and a metal layer 30 embedded in the dielectric layer. The wafer containing the large die is bonded to the other wafer in a hybrid bonding manner in which their dielectric layers are aligned with each other and their metal layers 31, 25 are also aligned with each other. The wafer containing the large die may be bonded either as a top wafer or as a bottom wafer. Without implying any limitation, the wafer containing the large die may be implemented as an image sensor wafer, a logic device wafer or the like as practically required.

Figure 4:
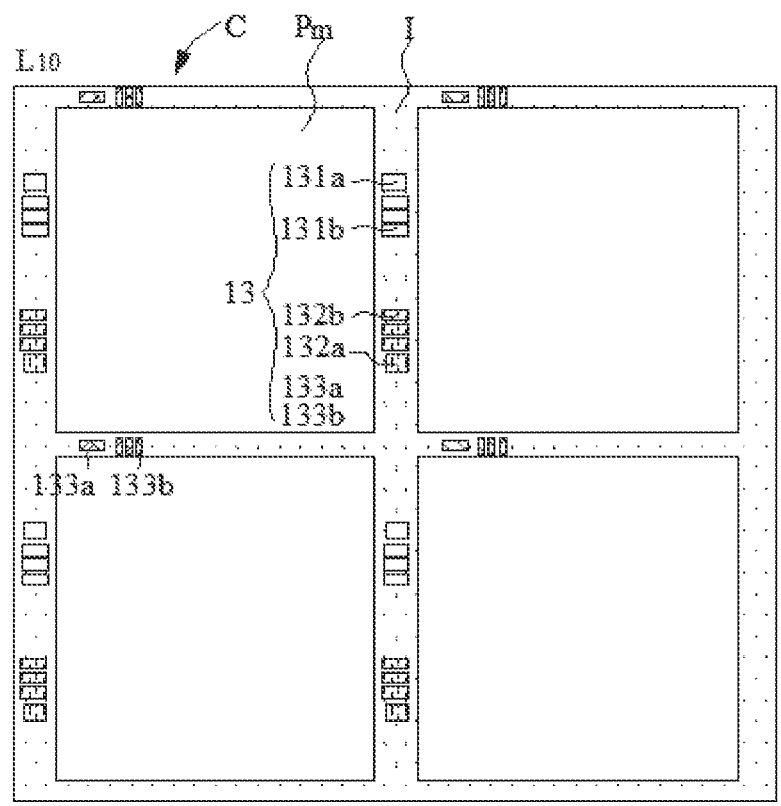
FIG. 4 shows a top view of a layer in which a first metal layer of the large die is located according to an embodiment of the present invention.

FIG. 4 shows a top view of a layer $L_{10}$ in which the first metal layer 10 of the large die is located according to an embodiment of the present invention. As shown in FIGS. 2 and 4, the first metal layer 10 may further include leading-out metal layers 12 for signal's leading out from the individual die portions P in a thickness direction thereof. The first metal layer 10 may further include first mark metal layers 13 having thereon first front-side alignment marks 131a and first front-side overlay marks 131b, second front-side alignment marks 132a and second front-side overlay marks 132b, as well as third front-side alignment marks 133a and third front-side overlay marks 133b.

As an example, the size of each die portion P is equal to that of the stepper's maximum field of exposure. Each die portion P includes a main die region Pm and dummy dicing margins I surrounding the main die region Pm. The first mark metal layers 13 may be disposed in the dummy dicing margins I. The to-be-interconnected metal layers 11, the leading-out metal layers 12 and the first mark metal layers 13 of the first metal layer may be formed in a same process.

The second metal layer 20 includes at least inter-die interconnecting metal layers 21 crossing the dummy dicing margins I between adjacent die portions and coming into electrical connection with the individual to-be-interconnected metal layers of the adjacent die portions.

As shown in FIGS. 2 and 7b, the second metal layer 20 may particularly include intra-die metal layers 22 and second mark metal layers 23. The second mark metal layers 23 may include first backside alignment marks 231a and first backside overlay marks 231b, second backside alignment marks 232a and second backside overlay marks 232b, as well as third backside alignment marks 233a and third backside overlay marks 233b.

The inter-die interconnecting metal layers 21 may include first interconnecting sections 21a and second interconnecting sections 21b. The second interconnecting sections 21b may include X-directional second interconnecting sections 21bx and Y-directional second interconnecting sections 21by. The first interconnecting sections 21a may be disposed in the main die region, while the second interconnecting sections 21b may cross the dummy dicing margins I between adjacent die portions, with their opposing end portions extending toward the first interconnecting sections 21a in the individual adjacent die portions and coming into electrical connection therewith.

The formation of the second metal layer may particularly include sequentially depositing a dielectric layer and photoresist over the first metal layer 10 on the wafer. The photoresist may be then exposed with a photomask and developed to define a photoresist pattern corresponding to the second metal layer. That is, the photoresist above the second metal layer to be formed may be removed during the development. The photomask for forming the second metal layer may have a pattern including a first photomask module, a second photomask module and a third photomask module. Among metal layers including the first and second metal layers, the second metal layer may be any of the second bottom-most to topmost layers, which are sequentially stacked from the substrate upward in the thickness direction of the large die.

Figure 5A:
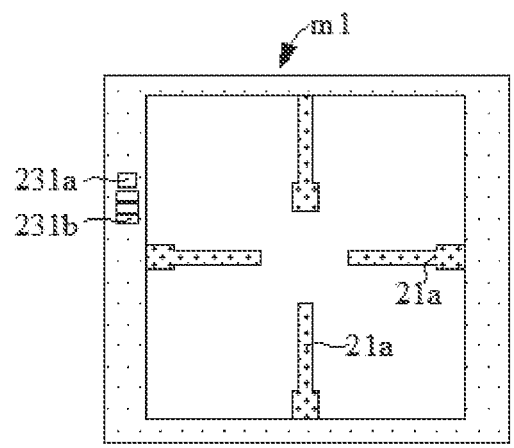
FIG. 5a is a top view of a first photomask module used in the method according to an embodiment of the present invention.
Figure 5B:
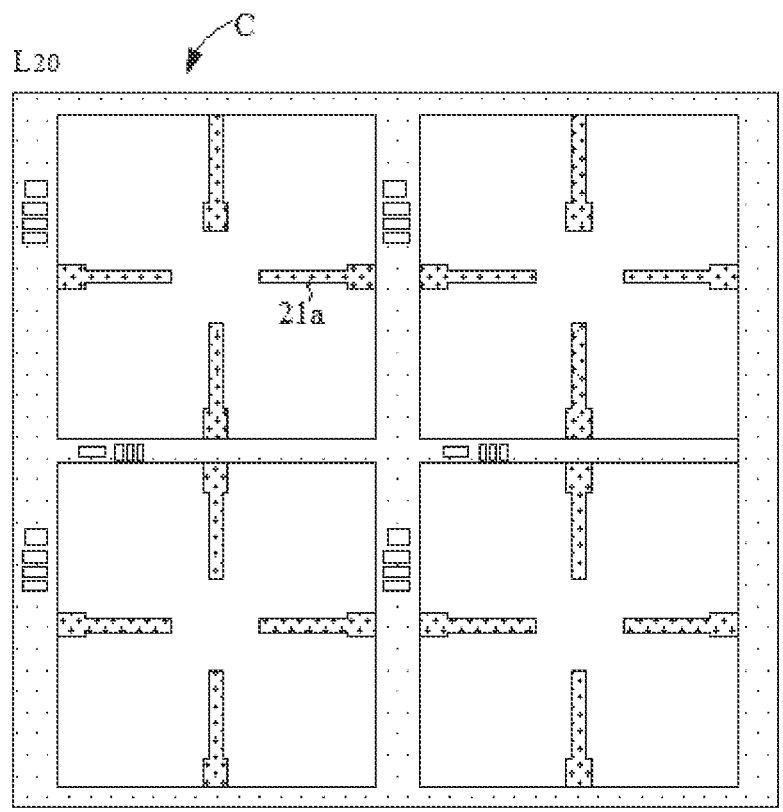
FIG. 5b is a top view of a pattern formed by exposure using the first photomask module and subsequent development in the method according to an embodiment of the present invention.

FIG. 5a is a top view of the first photomask module used in the formation of the large die according to an embodiment of the present invention. FIG. 5b is a top view of a pattern formed by exposure using the first photomask module and subsequent development during the formation of the large die according to an embodiment of the present invention. As shown in FIGS. 5a and 5b, the photoresist may be first exposed once with the first photomask module m1 to form a pattern corresponding to one of the die portions to be stitched together. The first photomask module m1 may have an exposure pattern including features for the first interconnecting sections 21a in the main die region, the first backside alignment marks 231a and the first backside overlay marks 231b in the dummy dicing margins. If practically necessary, the exposure pattern of the first photomask module m1 may optionally further include features for the intra-die metal layers 22 (not shown in the top views). The first interconnecting sections 21a in the main die region may be at least partially disposed above the to-be-interconnected metal layers 11 of the first metal layer 10. The first backside alignment marks 231a may be matched to the first front-side alignment marks 131a and the first backside overlay marks 231b to the first front-side overlay marks 131b in order to enable alignment of the second metal layer 20 with the first metal layer 10 during the exposure using the first photomask module m1.

Following the exposure of the pattern features on the photoresist for the first interconnecting sections 21a, the first backside alignment marks 231a, the first backside overlay marks 231b and the intra-die metal layers 22 of one of the die portions to be stitched together, this exposure step may be repeated using the first photomask module m1 to complete exposure for the remaining die portions. After that, portions of the photoresist over the wafer that have been exposed using the first photomask module m1 may be removed using a development solution.

FIG. 6a is a top view of the second photomask module used in the formation of the large die according to an embodiment of the present invention. FIG. 6b is a top view of a pattern formed by exposure using the second photomask module and subsequent development during the formation of the large die according to an embodiment of the present invention. As shown in FIGS. 6a and 6b, the photoresist may be again exposed using the second photomask module m2 The die portions to be stitched together may be, for example, square or rectangular in shape, and the X and Y directions may be defined as the directions in which their sides extend. The second interconnecting sections 21b may include X-directional second interconnecting sections 21bx and Y-directional second interconnecting sections 21by. While the second interconnecting sections 21b have been described above as extending in the X and Y directions, the present invention is not so limited, because they may alternatively extend in other directions than those two directions, as long as the second interconnecting sections 21b cross the dummy dicing margins I and bring the first interconnecting sections 21a of adjacent die portions into electrical connection.

The second photomask module m2 may have an exposure pattern including features for the X-directional second interconnecting sections 21bx, the second backside alignment marks 232a and the second backside overlay marks 232b in the dummy dicing margins. The X-directional second interconnecting sections 21bx may cross the dummy dicing margins I between adjacent die portions and bring the first interconnecting sections 21a of the individual die portions into electrical connection. The second backside alignment marks 232a may be matched to the second front-side alignment marks 132a and the second backside overlay marks 232b to the second front-side overlay marks 132b in order to enable alignment of the second metal layer 20 with the first metal layer 10 during the exposure using the second photomask module m2 In the exposure step using the second photomask module m2, exposure of the photoresist for the X-directional second interconnecting sections 21bx, the second backside alignment marks 232a and the second backside overlay marks 232b in the dummy dicing margins I for a pair of adjacent ones of the die portions may be completed, and this exposure step may be repeated to complete exposure for the remaining die portions. After that, portions of the photoresist over the wafer that have been exposed using the second photomask module m2 may be removed using a development solution.

Figure 7A:
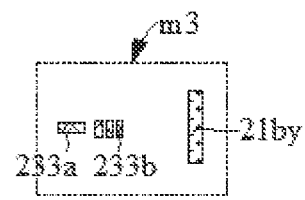
FIG. 7a is a top view of a third photomask module used in the method according to an embodiment of the present invention.
Figure 7B:
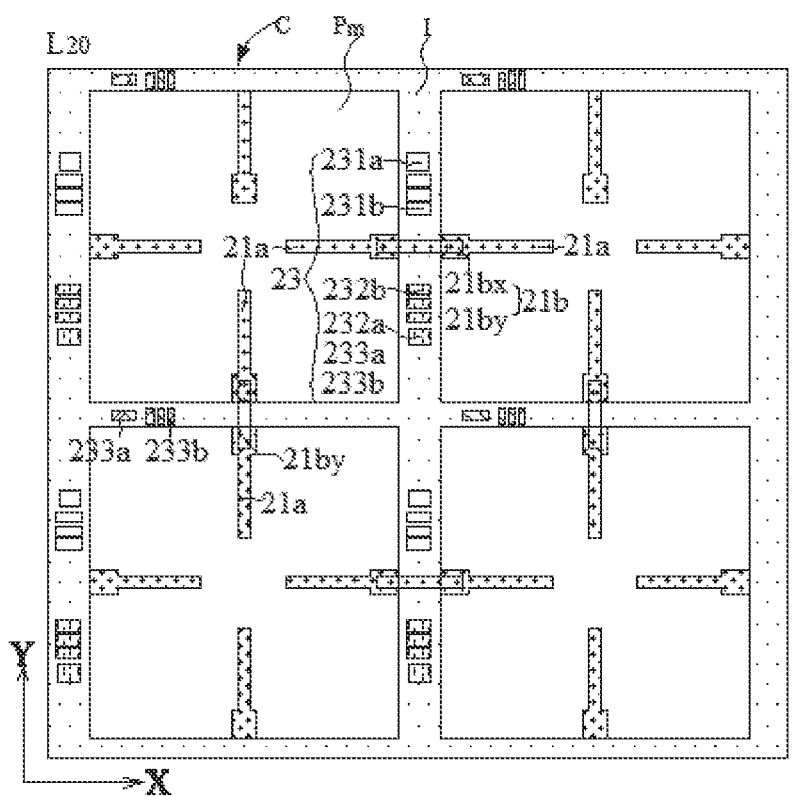
FIG. 7b is a top view of a pattern formed by exposure using the third photomask module and subsequent development in the method according to an embodiment of the present invention.

FIG. 7a is a top view of the third photomask module used in the formation of the large die according to an embodiment of the present invention. FIG. 7b is a top view of a pattern formed by exposure using the third photomask module and subsequent development during the formation of the large die according to an embodiment of the present invention. As shown in FIGS. 7a and 7b, the photoresist may be again exposed using the third photomask module m3. The third photomask module m3 may have an exposure pattern including features for the Y-directional second interconnecting sections 21by, the third backside alignment marks 233a and the third backside overlay marks 233b in the dummy dicing margins. The Y-directional second interconnecting sections 21by may cross the dummy dicing margins I between adjacent die portions and bring the first interconnecting sections 21a of the individual die portions into electrical connection. The third backside alignment marks 233a may be matched to the third front-side alignment marks 133a and the third backside overlay marks 233b to the third front-side overlay marks 133b in order to enable alignment of the second metal layer 20 with the first metal layer 10 during the exposure using the third photomask module m3. In the exposure step using the third photomask module m3, exposure of the photoresist for the Y-directional second interconnecting sections 21by, the third backside alignment marks 233a and the third backside overlay marks 233b in the dummy dicing margins I for a pair of adjacent ones of the die portions may be completed, and this exposure step may be repeated to complete exposure for the remaining die portions. After that, portions of the photoresist over the wafer that have been exposed using the third photomask module m3 may be removed using a development solution.

In an embodiment, the first photomask module m1 may be provided as a separate photomask (reticle), while the second and third photomask modules m2 and m3 may be provided together as a photomask (reticle). When the second photomask module m2 is used to expose the photoresist, the third photomask module m3 may be covered up. Likewise, when the third photomask module m3 is used to expose the photoresist, the second photomask module m2 may be covered up.

An etching process may be performed on portions of the dielectric layer exposed from the photoresist (corresponding to the inter-die interconnecting metal layers 21 and the intra-die metal layers 22) to form therein openings in which the first metal layer 10 is exposed. The second metal layer 20 may be then filled in the openings. Materials from which the second metal layer can be fabricated may include copper, tungsten and any other material suitable for interconnection. Additionally, shallow trenches in which the first metal layer 10 is not necessarily exposed may also be formed in the etching process at portions of the dielectric layer exposed from the photoresist (corresponding to the second mark metal layers 23), and the second mark metal layers 23 configured for overlay alignment may be subsequently formed in the shallow trenches by filling them with the material of the second metal layer 20. As an example, the second metal layer 20 may be formed by electroplating of copper. Afterward, a chemical mechanical polishing process may be performed to planarize a top surface of the second metal layer. In this way, the metal filled in the openings forms the intra-die metal layers 22 and the inter-die interconnecting metal layers 21. The intra-die metal layers 22 connect the leading-out metal layers 12 in the first metal layer 10 of the die portions to be stitched together to the second metal layer 20. The inter-die interconnecting metal layers 21 may include the first interconnecting sections 21a, the X-directional second interconnecting sections 21bx and the Y-directional second interconnecting sections 21by and may serve for electrical interconnection of the to-be-interconnected metal layers 11 in the first metal layer 10 between the different die portions.

The second metal layer 20 may be taken as being planar (e.g., 22 and 21), while metal structures formed in holes extending in the wafer's thickness direction may serve as plugs 24. With this in mind, plugs 24 may be formed in the dielectric layer between the first and second metal layers 10 and 20 as interconnects extending in the wafer's thickness direction and electrically connecting the first metal layer 10 to the second metal layer 20. The plugs 24 may be formed in a separate process, which may precede the formation of the second metal layer 20. In other embodiments, the plugs 24 may be taken as part of the second metal layer 20. In this case, the second metal layer 20 includes both planar portions (e.g., 22 and 21) and the plugs 24 (metal layers filled in holes extending in the wafer's thickness direction), which may be formed in a single process in which the material of the second metal layers 20 are filled in both vertical holes and planar recesses.

The inter-die interconnecting metal layers 21 serve to connect the to-be-interconnected metal layers 11 of adjacent die portions to be stitched together. The second metal layer 20 may be adjacent to the first metal layer 10, and may be formed subsequent to the formation of the first metal layer 10.

Therefore, large die level interconnection is achieved by the above-discussed interconnection design of the die portions. The interconnection design allows functional extension of the smaller die portions and optimized electrical signal interconnection of the large die. Thus, increased functional integration is realized, and the problem that interconnection of individual to-be-stitched portions of a large die is limited by a maximum field of exposure is solved.

The present invention also provides a large die wafer.

The large die wafer includes a number of large dies each having a size greater than that of a maximum field of exposure of a stepper. Each large die includes at least two die portions to be stitched together, and each of the die portions includes a main die region and dummy dicing margin surrounding the main die region. Each of the die portions has a size that is smaller than or equal to that of the stepper's maximum field of exposure.

The die portions each include a substrate, a dielectric layer on the substrate and a first metal layer embedded in the dielectric layer. The first metal layer includes at least to-be-interconnected metal layers for interconnection of the die portions to be stitched together.

A second metal layer includes at least inter-die interconnecting metal layers crossing the dummy dicing margins between adjacent die portions and coming into electrical connection with the to-be-interconnected metal layers of the adjacent die portions.

The large die wafer may have a thickness of 1 μm to 50 μm.

The present invention also provides a large die.

The large die has a size greater than that of a maximum field of exposure of a stepper. The large die includes at least two die portions to be stitched together, and each of the die portions includes a main die region and dummy dicing margin surrounding the main die region. Each of the die portions has a size that is smaller than or equal to that of the stepper's maximum field of exposure.

The die portions each include a substrate, a dielectric layer on the substrate and a first metal layer embedded in the dielectric layer. The first metal layer includes at least to-be-interconnected metal layers for interconnection of the die portions to be stitched together.

A second metal layer includes at least inter-die interconnecting metal layers crossing the dummy dicing margins between adjacent die portions and coming into electrical connection with the to-be-interconnected metal layers of the adjacent die portions.

In summary, in embodiments of the present invention, there are provided a large die, a method of forming the large die, and a large die wafer. The method includes: providing a wafer containing a number of large dies each having a size greater than that of a maximum field of exposure of a stepper, each large die including at least two die portions to be stitched together, each die portion including a main die region and dummy dicing margins surrounding the main die region, the die portions each including a substrate and a first metal layer, the first metal layer including at least to-be-interconnected metal layers for interconnection of the die portions; and forming a second metal layer including at least inter-die interconnecting metal layers crossing the dummy dicing margins between adjacent die portions and coming into electrical connection with the to-be-interconnected metal layers of the adjacent die portions. According to the present invention, large die level interconnection is achieved by the above interconnection design of the die portions. The interconnection design allows functional extension of the smaller die portions and optimized electrical signal interconnection of the large die, thus realizing increased functional integration. It supports the stitching of repeated patterns exposed at the full mask size, i.e., a full size process, which allows the fabrication of full size three-dimensionally integrated dies with increased flexibility and higher compatibility.

The embodiments disclosed herein are described in a progressive manner, with the description of each embodiment focusing on its differences from others. Reference can be made between the embodiments for their identical or similar parts. Since the method embodiments correspond to the device embodiments, they are described relatively briefly, and reference can be made to the device embodiments for details in them.

While the invention has been described above with reference to several preferred embodiments, it is not intended to be limited to these embodiments in any way. In light of the teachings hereinabove, any person of skill in the art may make various possible variations and changes to the disclosed embodiments without departing from the scope of the invention. Accordingly, any and all such simple variations, equivalent alternatives and modifications made to the foregoing embodiments without departing from the scope of the invention are intended to fall within the scope thereof.

What is claimed is:

1. A method of forming a large die, the method comprising:
   providing a wafer comprising a plurality of large dies each having a size greater than a size of a maximum field of exposure of a stepper, each of the large dies comprising at least two die portions to be stitched together, each of the die portions comprising a main die region and dummy dicing margins surrounding the main die region, each of the die portions having a size that is smaller than or equal to the size of the maximum field of exposure of the stepper, the die portions each comprising a substrate, a dielectric layer on the substrate and a first metal layer embedded in the dielectric layer, the first metal layer comprising at least to-be-interconnected metal layers for interconnection of the die portions to be stitched together; and
   forming a second metal layer comprising at least inter-die interconnecting metal layers crossing the dummy dicing margins between adjacent ones of the die portions and coming into electrical connection with the to-be-interconnected metal layers of the adjacent ones of the die portions;
   wherein the first metal layer further comprises leading-out metal layers in the main die region, wherein the second metal layer further comprises intra-die metal layers in the main die region, and wherein in each die portion, the intra-die metal layers are electrically connected to the leading-out metal layers along a thickness direction of the die portion, and
   wherein the first metal layer further comprises first mark metal layers, the to-be-interconnected metal layers, the leading-out metal layers and the first mark metal layers of the first metal layer are formed in a same process.

2. The method of claim 1, wherein the inter-die interconnecting metal layers comprise first interconnecting sections and second interconnecting sections, the first interconnecting sections disposed in the main die region, the second interconnecting sections crossing the dummy dicing margins between adjacent ones of the die portions and coming into electrical connection with the to-be-interconnected metal layers of the adjacent ones of the die portions.

3. The method of claim 2, wherein the formation of the second metal layer comprises:
   forming a photoresist over the dielectric layer; and
   exposing the die portions successively one by one using a first photomask module, the first photomask module having an exposure pattern comprising at least features for the first interconnecting sections in the main die region.

4. The method of claim 2, wherein the second interconnecting sections comprise X-directional second interconnecting sections and Y-directional second interconnecting sections,
   the X-directional second interconnecting sections extending along an X direction and coming into electrical connection with X-directionally extending first interconnecting sections of adjacent ones of the die portions to be stitched together,
   the Y-directional second interconnecting sections extending along a Y direction and coming into electrical connection with Y-directionally extending first interconnecting sections of adjacent ones of the die portions to be stitched together.

5. The method of claim 4, wherein the formation of the second metal layer further comprises:
   exposing the X-directional second interconnecting sections of adjacent ones of the die portions on the photoresist successively one by one using a second photomask module, the second photomask module having an exposure pattern comprising at least features for the X-directional second interconnecting sections; and
   exposing the Y-directional second interconnecting sections of adjacent ones of the die portions on the photoresist successively one by one using a third photomask module, the second photomask module having an exposure pattern comprising at least features for the Y-directional second interconnecting sections.

6. The method of claim 5, wherein the formation of the second metal layer further comprises:
   performing an etching process on portions of the dielectric layer exposed from the photoresist, which correspond to the first interconnecting sections, the X-directional second interconnecting sections and the Y-directional second interconnecting sections, to form openings in which the first metal layer is exposed;

filling the openings with a metal layer to form the inter-die interconnecting metal layers; and planarizing a top surface of the second metal layer using a chemical mechanical polishing process.

7. The method of claim 3, wherein the first mark metal layers include first front-side alignment marks, first front-side overlay marks, second front-side alignment marks, second front-side overlay marks, third front-side alignment marks and third front-side overlay marks.

8. The method of claim 7, wherein the second metal layer further comprises second mark metal layers including first backside alignment marks, first backside overlay marks, second backside alignment marks, second backside overlay marks, third backside alignment marks and third backside overlay marks;

the first backside alignment marks are matched to the first front-side alignment marks, and the first backside overlay marks are matched to the first front-side overlay marks, in order to enable alignment of the second metal layer with the first metal layer during the exposure using the first photomask module;

the second backside alignment marks are matched to the second front-side alignment marks, and the second backside overlay marks are matched to the second front-side overlay mark, in order to enable alignment of the second metal layer with the first metal layer during the exposure using the second photomask module; and the third backside alignment marks are matched to the third front-side alignment marks, and the third backside overlay marks are matched to the third front-side overlay marks, in order to enable alignment of the second metal layer with the first metal layer during the exposure using the third photomask module.

9. The method of claim 1, wherein the second metal layer is any of the second bottom-most to topmost metal layers, which are sequentially stacked from the substrate upward along a thickness direction of the large dies.

10. A large die wafer, comprising a plurality of large dies each having a size greater than a size of a maximum field of exposure of a stepper, each of the large dies comprising:

at least two die portions to be stitched together, each of the die portions comprising a main die region and dummy dicing margins surrounding the main die region, each of the die portions having a size that is smaller than or equal to the size of the maximum field of exposure of the stepper, the die portions each comprising a substrate, a dielectric layer on the substrate and a first metal layer embedded in the dielectric layer, the first metal layer comprising at least to-be-interconnected metal layers for interconnection of the die portions to be stitched together; and a second metal layer comprising at least inter-die interconnecting metal layers crossing the dummy dicing margins between adjacent die portions and coming into electrical connection with the to-be-interconnected metal layers of the adjacent die portions;

wherein the first metal layer further comprises leading-out metal layers in the main die region, wherein the second metal layer further comprises intra-die metal layers in the main die region, and wherein in each die portion, the intra-die metal layers are electrically connected to the leading-out metal layers along a thickness direction of the die portion, and wherein the first metal layer further comprises first mark metal layers, the to-be-interconnected metal layers, the leading-out metal layers and the first mark metal layers of the first metal layer are formed in a same metal layer.

11. The large die wafer of claim 10, wherein the inter-die interconnecting metal layers comprise first interconnecting sections and second interconnecting sections, the first interconnecting sections disposed in the main die region, the second interconnecting sections crossing the dummy dicing margins between adjacent ones of the die portions and coming into electrical connection with the to-be-interconnected metal layers of the adjacent ones of the die portions.

12. The large die wafer of claim 11, wherein the second interconnecting sections comprise X-directional second interconnecting sections and Y-directional second interconnecting sections, the X-directional second interconnecting sections extending along an X direction and coming into electrical connection with X-directionally extending first interconnecting sections of adjacent ones of the die portions to be stitched together, the Y-directional second interconnecting sections extending along a Y direction and coming into electrical connection with Y-directionally extending first interconnecting sections of adjacent ones of the die portions to be stitched together.

13. The large die wafer of claim 10, wherein the large die wafer has a thickness of 1 µm to 50 µm.

14. A large die, having a size greater than a size of a maximum field of exposure of a stepper, the large die comprising:

at least two die portions to be stitched together, each of the die portions comprising a main die region and dummy dicing margins surrounding the main die region, each of the die portions having a size that is smaller than or equal to the size of the maximum field of exposure of the stepper, the die portions each comprising a substrate, a dielectric layer on the substrate and a first metal layer embedded in the dielectric layer, the first metal layer comprising at least to-be-interconnected metal layers for interconnection of the die portions to be stitched together; and a second metal layer comprising at least inter-die interconnecting metal layers crossing the dummy dicing margins between adjacent die portions and coming into electrical connection with the to-be-interconnected metal layers of the adjacent die portions;

wherein the first metal layer further comprises leading-out metal layers in the main die region, wherein the second metal layer further comprises intra-die metal layers in the main die region, and wherein in each die portion, the intra-die metal layers are electrically connected to the leading-out metal layers along a thickness direction of the die portion, and wherein the first metal layer further comprises first mark metal layers, the to-be-interconnected metal layers, the leading-out metal layers and the first mark metal layers of the first metal layer are formed in a same metal layer.

15. The large die of claim 14, wherein the inter-die interconnecting metal layers comprise first interconnecting sections and second interconnecting sections, the first interconnecting sections disposed in the main die region, the second interconnecting sections crossing the dummy dicing margins between adjacent ones of the die portions and coming into electrical connection with the to-be-interconnected metal layers of the adjacent ones of the die portions.

16. The large die of claim 15, wherein the second interconnecting sections comprise X-directional second interconnecting sections and Y-directional second interconnecting sections, the X-directional second interconnecting sections extending along an X direction and coming into electrical connection with X-directionally extending first interconnecting sections of adjacent ones of the die portions to be stitched together, the Y-directional second interconnecting sections extending along a Y direction and coming into electrical connection with Y-directionally extending first interconnecting sections of adjacent ones of the die portions to be stitched together.

17. The method of claim 1, wherein both topmost ones of the intra-die metal layers and the inter-die interconnecting metal layers are located in a same layer.

18. The method of claim 1, wherein the inter-die interconnecting metal layers and the intra-die metal layers are formed by using a single photomask.

19. The large die wafer of claim 10, the inter-die interconnecting metal layers and the intra-die metal layers are flush with each other.

20. The large die of claim 14, the inter-die interconnecting metal layers and the intra-die metal layers are flush with each other.

* * * * *